(12) United States Patent
Takeoka

(10) Patent No.: US 8,513,724 B2
(45) Date of Patent: Aug. 20, 2013

(54) SEMICONDUCTOR DEVICE

(75) Inventor: Shinji Takeoka, Toyama (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 13/290,638

(22) Filed: Nov. 7, 2011

(65) Prior Publication Data
US 2012/0049297 A1    Mar. 1, 2012

Related U.S. Application Data

(63) Continuation of application No. PCT/JP2009/006843, filed on Dec. 14, 2009.

(30) Foreign Application Priority Data

May 25, 2009   (JP) ................................ 2009-124943

(51) Int. Cl.
*H01L 27/108*    (2006.01)
*H01L 29/94*     (2006.01)

(52) U.S. Cl.
USPC ................. 257/310; 257/410; 257/E29.255; 438/240

(58) Field of Classification Search
USPC ................. 257/410, 310, E29.015, E29.02, 257/E21.02, E29.051, E27.06, E29.255; 438/240, 310, 151, 197
See application file for complete search history.

(56) References Cited

U.S. PATENT DOCUMENTS

| 7,217,643 B2 * | 5/2007 | Liang et al. | 438/591 |
| 7,863,127 B2 * | 1/2011 | Mise et al. | 438/216 |
| 2002/0137250 A1 | 9/2002 | Nguyen et al. | |
| 2002/0137317 A1 | 9/2002 | Kaushik et al. | |
| 2007/0210354 A1 | 9/2007 | Nabatame et al. | |
| 2008/0128822 A1 | 6/2008 | Koyama et al. | |
| 2008/0308865 A1 | 12/2008 | Wang et al. | |
| 2009/0114996 A1 | 5/2009 | Inumiya et al. | |

FOREIGN PATENT DOCUMENTS

| JP | 2004-304053 | 10/2004 |
| JP | 2004-304053 A | 10/2004 |
| JP | 2004-533108 | 10/2004 |
| JP | 2007-067229 | 3/2007 |
| JP | 2007-067229 A | 3/2007 |

(Continued)

OTHER PUBLICATIONS

Hag-Ju Cho et al., "The Impact of Stacked Cap Layers on Effective Work Function With HfSiON and SiON Gate Dielectrics," IEEE Electron Device Letters, vol. 29, No. 7, Jul. 2008, pp. 743-745.

(Continued)

*Primary Examiner* — Jarrett Stark
*Assistant Examiner* — Shahed Ahmed
(74) *Attorney, Agent, or Firm* — McDermott Will & Emery LLP

(57) ABSTRACT

A gate insulating film includes an oxygen-containing insulating film and a high dielectric constant insulating film formed on the oxygen-containing insulating film and containing a first metal. The high dielectric constant insulating film further includes a second metal different from the first metal. Part of the high dielectric constant insulating film having the maximum composition ratio of the second metal is away from an interface between the high dielectric constant insulating film and the oxygen-containing insulating film and an interface between the high dielectric constant insulating film and the gate electrode. The second metal exists also in a portion of the oxygen-containing insulating film near the interface between the high dielectric constant insulating film and the oxygen-containing insulating film.

15 Claims, 9 Drawing Sheets

(56) References Cited

FOREIGN PATENT DOCUMENTS

| JP | 2007-243009 | 9/2007 |
|----|-------------|--------|
| JP | 2007-329237 | 12/2007 |
| JP | 2008-243994 | 10/2008 |
| JP | 2009-054609 | 3/2009 |

OTHER PUBLICATIONS

A. Veloso et al., "Flexible and Robust Capping-Metal Gate Integration Technology enabling multiple-$V_T$ CMOS in MuGFETs," 2008 Symposium on VLSI Technology Digest of Technical Papers, pp. 14-15.

P. Sivasubramani et al., "Dipole Moment Model Explaining nFET $V_T$ Tuning Utilizing La, Sc, Er Doped hfSiON Dielectrics," 2007 Symposium on VLSI Technology Digest of Technical Papers, pp. 68-69.

S. Kubicek et a., "Strin enhanced Low $V_T$ CMOS featuring La/Al-doped HfSiO/TaC and 10ps Invertor Delay," 2008 Symposium on VLSI Technology Digest of Technical Papers, pp. 130-131.

International Search Report issued in International Patent Application No. PCT/JP2009/006843 dated Mar. 23, 2010.

* cited by examiner

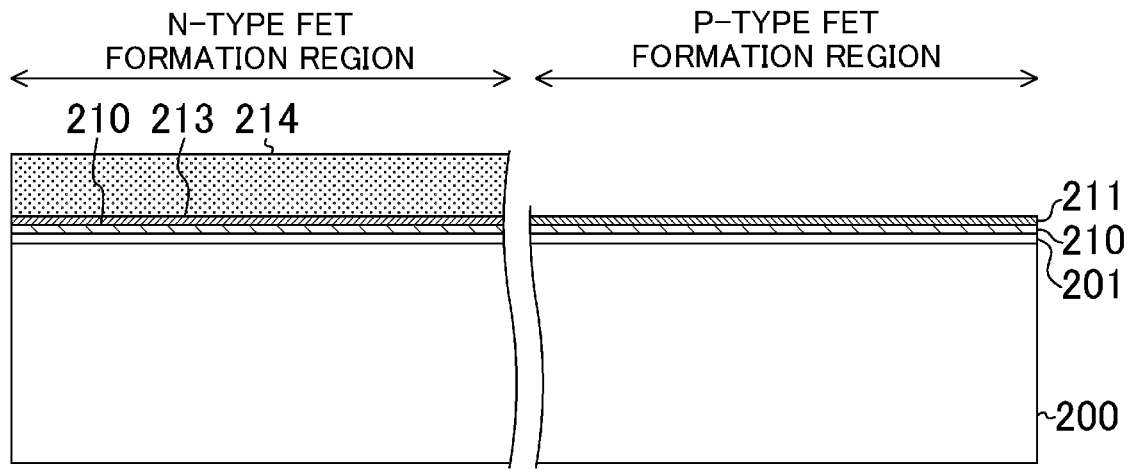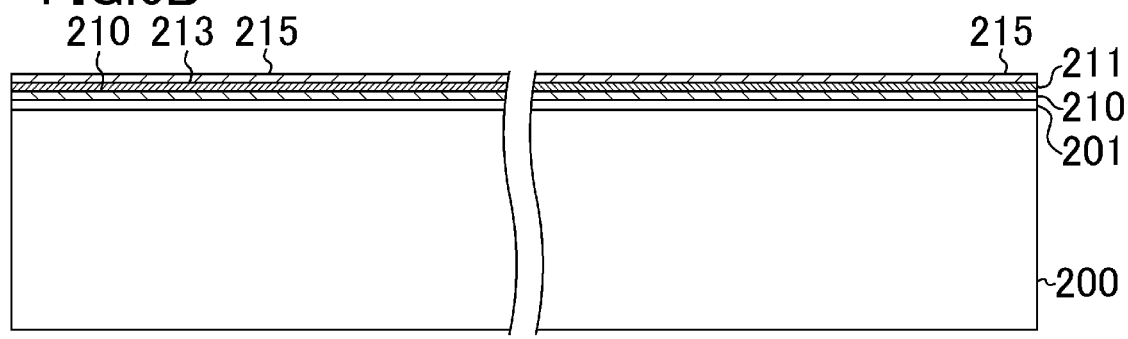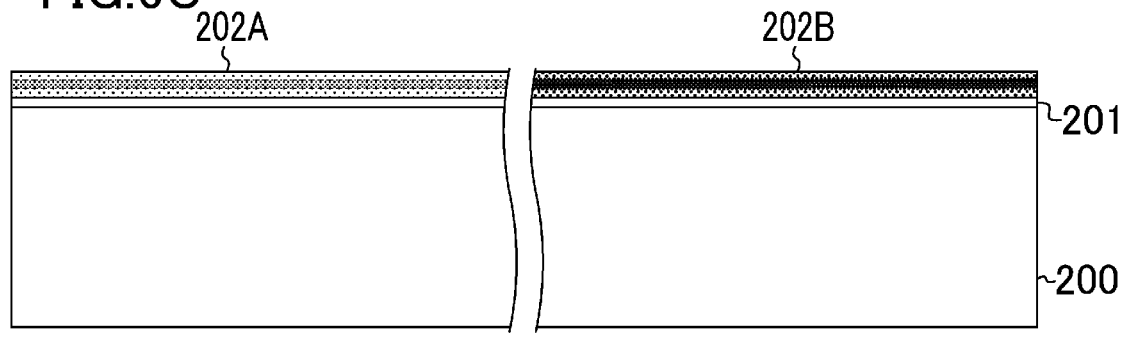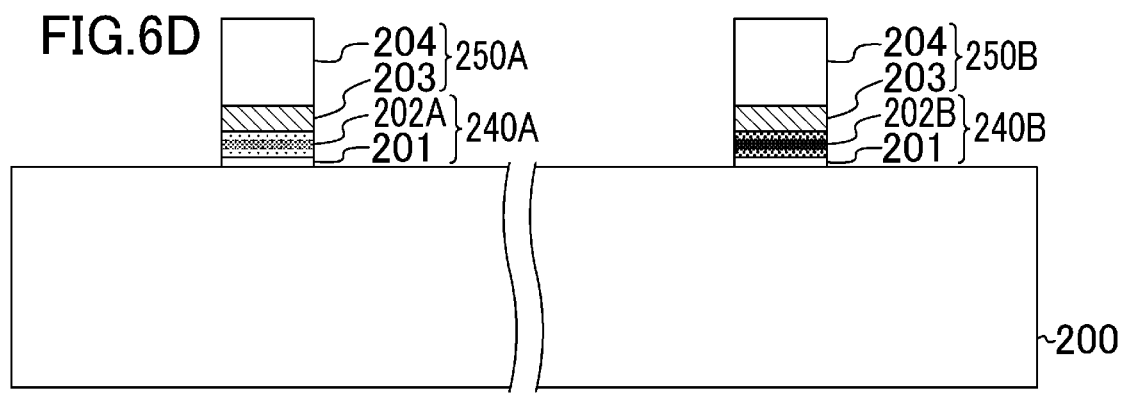

SEMICONDUCTOR DEVICE

CROSS-REFERENCE TO RELATED APPLICATION

This is a continuation of PCT International Application PCT/JP2009/006843 filed on Dec. 14, 2009, which claims priority to Japanese Patent Application No. 2009-124943 filed on May 25, 2009. The disclosures of these applications including the specifications, the drawings, and the claims are hereby incorporated by reference in their entirety.

BACKGROUND

The present disclosure relates to a semiconductor device and a method for fabricating the semiconductor device, and particularly relates to a semiconductor device including a transistor using a high dielectric constant insulating film as a gate insulating film and a method for fabricating the semiconductor device.

As a design rule of a semiconductor device is scaled down, a degree of integration of a circuit is dramatically improved. Thus, more than hundred million field effect transistors (FETs) can be mounted on a single chip. In order to realize a high-performance transistor, not only reduction in gate length but also reduction in thickness of a gate insulating film are required. Conventionally, e.g., a silicon oxide film or a silicon oxynitride film which is a nitride film of the silicon oxide film has been used as the gate insulating film. However, if an equivalent oxide thickness (EOT) is reduced to equal to or less than about 2 nm, gate-leakage current is increased, thereby causing a problem that power consumption of the circuit is increased.

Increasing attention has been given to a high dielectric constant gate insulating film in order to reduce the gate-leakage current and reduce the EOT. A "high dielectric constant insulating film" means an insulating film having a dielectric constant higher than a dielectric constant (about 8.0) of a silicon nitride film.

In order to further reduce the EOT, a variety of techniques have been developed for a transistor in which a gate electrode using metal material such as titanium nitride and tantalum nitride is combined with a high dielectric constant gate insulating film, i.e., a transistor having a high dielectric constant gate insulating film/metal gate electrode structure, instead of a conventional gate electrode using silicon material.

One of challenges to realizing the high dielectric constant gate insulating film/metal gate electrode structure is control of threshold voltage of the transistor. In the conventional silicon electrode, a work function of the silicon electrode is adjusted by impurity ion implantation, thereby realizing threshold voltage suitable for each of an N-type FET and a P-type FET. That is, for the N-type FET, an attempt is made to reduce the work function by implanting an N-type impurity such as arsenic and phosphorus to the silicon electrode. On the other hand, for the P-type FET, an attempt is made to increase the work function by implanting a P-type impurity such as boron to the silicon electrode.

However, for the metal gate electrode, the work function cannot be controlled by the impurity ion implantation, and therefore the control of the threshold voltage of the transistor having the metal gate electrode is a great challenge.

As a method for controlling the work function of the transistor having the high dielectric constant gate insulating film/metal gate electrode structure, a method has been proposed, in which metal is added so that an electric dipole for reducing the threshold voltage can be formed at an interface between an oxide film on a surface of a semiconductor substrate and the high dielectric constant gate insulating film (see P. Sivasubramani et al., Dipole Moment Model Explaining nFET Vt Tuning Utilizing La, Sc, Er, and Sr Doped HfSiON Dielectrics, Symposium on VLSI Technology Digest of Technical Papers, 2007, pp. 68-69, and S. Kubicek et al., Strain Enhanced Low-VT CMOS Featuring La/Al-doped HfSiO/TaC and 10 μs Inventor Delay, Symposium on VLSI Technology Digest of Technical Papers, 2008, pp. 130-131).

FIG. 8A illustrates a configuration described in Sivasubramani et al., i.e., a configuration in a cross section of a transistor structure in which lanthanum is, as metal forming an electric dipole at an interface between an oxide film on a surface of a semiconductor substrate and a high dielectric constant gate insulating film, added to an N-type FET having a hafnium silicon oxynitride high dielectric constant gate insulating film/metal gate electrode structure. As illustrated in FIG. 8A, in the N-type FET disclosed in Sivasubramani et al., a high dielectric constant insulating film 502 made of hafnium silicon oxynitride (HfSiON) is stacked on a silicon oxide film 501 formed on a silicon substrate 500. In addition, a metal electrode 504 made of TiN is stacked on the high dielectric constant insulating film 502 with a metal oxide film 503 made of lanthanum (La) being interposed therebetween.

FIG. 8B illustrates a composition distribution (composition distribution in a direction perpendicular to a principal surface of the substrate) obtained by performing activation annealing for the high dielectric constant gate insulating film/metal gate electrode structure illustrated in FIG. 8A and diffusing lanthanum atoms. As illustrated in FIG. 8B, the lanthanum (La) atoms are diffused to an interface between the silicon oxide film ($SiO_2$) 501 and the high dielectric constant gate insulating film 502 through the high dielectric constant gate insulating film (HfSiON) 502, and, as a result, the electric dipole can be formed at such an interface. This reduces threshold voltage of the N-type FET by about 230 mV. Note that, as illustrated in FIG. 8B, the lanthanum atoms are also diffused in the metal electrode (TiN) 504, and a lanthanum composition ratio (La concentration) is substantially the maximum at an interface between the metal electrode 504 and the high dielectric constant gate insulating film 502.

FIG. 9A illustrates a configuration in a cross section of a transistor structure described in Kubicek et al., and specifically illustrates a configuration in a cross section of a transistor structure in which a metal oxide film such as a lanthanum oxide film (N-type FET) and an aluminum oxide film (P-type FET) is stacked below a high dielectric constant gate insulating film, and therefore an electric dipole for reducing threshold voltage is formed at an interface between the oxide film on a surface of a semiconductor substrate and the high dielectric constant gate insulating film. As illustrated in FIG. 9A, in the FET disclosed in Kubicek et al., a high dielectric constant insulating film 502 made of hafnium silicon oxynitride (HfSiON) is stacked on a silicon oxide film 501 formed on a silicon substrate 500 with a metal oxide film 503 containing lanthanum (La) or aluminum (Al) being interposed therebetween. In addition, a metal electrode 504 made of TiN is stacked on the high dielectric constant insulating film 502. FIG. 9B illustrates a composition distribution (composition distribution in a direction perpendicular to a principal surface of the substrate) obtained by performing activation annealing for the high dielectric constant gate insulating film/metal gate electrode structure (in a case where the metal oxide film containing lanthanum (La) is used as the metal oxide film 503) illustrated in FIG. 9A and diffusing lanthanum atoms. As illustrated in FIG. 9B, the lanthanum atoms exist at an interface between the silicon oxide film ($SiO_2$) 501 and the high dielectric constant gate insulating film (HfSiON) 502, and, as a result, the electric dipole can be formed at such an interface. This reduces the threshold voltage of the N-type FET by about 500 mV. Note that, as illustrated in FIG. 9B, the lanthanum atoms are also diffused in each of the silicon oxide film 501 and the high dielectric constant gate insulating film 502, and a lanthanum composition ratio (La concentration) is substantially the maximum at the interface between the silicon oxide film 501 and the high dielectric constant gate insulating film 502. If the metal oxide film containing aluminum (Al) is used as the metal oxide film 503, the threshold voltage of the P-type FET can be reduced by about 200 mV.

SUMMARY

However, if the threshold voltage is controlled by the methods disclosed in Sivasubramani et al. and Kubicek et al., there is a problem that it is difficult to optimize a formation condition of the metal oxide film (e.g., the lanthanum oxide film or the aluminum oxide film) forming the dipole for reducing the threshold voltage at the interface between the silicon oxide film and the high dielectric constant gate insulating film.

Specifically, in a case where the metal oxide film 503 such as the lanthanum oxide film or the aluminum oxide film is stacked on the high dielectric constant gate insulating film 502 as illustrated in FIG. 8A, lanthanum atoms or aluminum atoms are diffuse to the interface between the silicon oxide film 501 and the high dielectric constant gate insulating film 502 by heat treatment such as activation annealing performed after formation of the metal oxide film 503, thereby reducing the threshold voltage. In such a case, in order to diffuse the lanthanum atoms or the aluminum atoms in the high dielectric constant gate insulating film 502 having a relatively large thickness (2-3 nm), it is necessary that the metal oxide film 503 such as the lanthanum oxide film or the aluminum oxide film is formed so as to have a relatively large thickness (about 1 nm). However, the lanthanum oxide film or the aluminum oxide film is an insulator. Thus, if the thick metal oxide film 503 is formed, the EOT of the entire gate insulating film is increased, thereby degrading transistor characteristics.

On the other hand, if the metal oxide film 503 such as the lanthanum oxide film or the aluminum oxide film is stacked below the high dielectric constant gate insulating film 502 as illustrated in FIG. 9A, the lanthanum oxide film or the aluminum oxide film is formed between the silicon oxide film 501 and the high dielectric constant gate insulating film 502. Thus, by the thin metal oxide film 503 (a thickness of equal to or less than 0.5 nm) such as the lanthanum oxide film or the aluminum oxide film, the threshold voltage can be reduced as much as in the foregoing case where the metal oxide film 503 is stacked on the high dielectric constant gate insulating film 502. As a result, the increase in EOT of the entire gate insulating film can be reduced. However, there is a possibility that the lanthanum atoms or the aluminum atoms are also diffused in the silicon substrate 500 by the heat treatment such as activation annealing performed after the formation of the metal oxide film 503. As in such a state, if the lanthanum atoms or the aluminum atoms are diffused in the silicon substrate 500, carrier mobility is degraded, thereby degrading the transistor characteristics.

In view of the foregoing, it is an objective of the present disclosure to suppress an increase in EOT and degradation of carrier mobility while adding metal which can form an electric dipole for reducing threshold voltage at an interface between an oxide film on a surface of a semiconductor substrate and a high dielectric constant insulating film.

In order to achieve the foregoing objective, the inventor of the present disclosure have arrived at diffusing lanthanum atoms or aluminum atoms by heat treatment after a structure in which a metal oxide film such as a lanthanum oxide film or an aluminum oxide film is sandwiched between upper and lower high dielectric constant insulating films is formed. In such a manner, a novel structure can be obtained, in which a lanthanum composition ratio (concentration) or an aluminum composition ratio (concentration) is the maximum inside the high dielectric constant gate insulating film.

Specifically, a semiconductor device of the present disclosure includes a first gate insulating film formed on a first region of a semiconductor substrate; and a first gate electrode formed on the first gate insulating film. The first gate insulating film includes a first oxygen-containing insulating film and a first high dielectric constant insulating film formed on the first oxygen-containing insulating film and containing a first metal. The first high dielectric constant insulating film further contains a second metal different from the first metal. Part of the first high dielectric constant insulating film having a maximum composition ratio of the second metal is away from an interface between the first high dielectric constant insulating film and the first oxygen-containing insulating film and an interface between the first high dielectric constant insulating film and the first gate electrode.

That is, the semiconductor device of the present disclosure is obtained by diffusing the lanthanum atoms, the aluminum atoms, or the like by the heat treatment after the structure in which the metal oxide film such as the lanthanum oxide film or the aluminum oxide film is sandwiched between the upper and lower high dielectric constant insulating films is formed According to the semiconductor device of the present disclosure, a thickness of the high dielectric constant insulating film provided below the metal oxide film can be reduced as compared to a structure obtained by performing heat treatment after a metal oxide film such as a lanthanum oxide film or an aluminum oxide film is formed on a high dielectric constant insulating film. As a result, a thickness of the metal oxide film required for reducing threshold voltage, such as the lanthanum oxide film or the aluminum oxide film can be reduced, and therefore an increase in EOT of the entire gate insulating film and degradation of transistor characteristics due to the increase in EOT can be suppressed.

In addition, according to the semiconductor device of the present disclosure, a thickness of the insulating film (a multilayer structure of the high dielectric constant insulating film and an oxygen-containing insulating film such as a silicon oxide film) provided below the metal oxide film can be increased as compared to a structure obtained by performing heat treatment after a metal oxide film such as a lanthanum oxide film or an aluminum oxide film is formed below a high dielectric constant insulating film. As a result, diffusion of, e.g., the lanthanum atoms or the aluminum atoms in the semiconductor substrate due to the heat treatment such as activation annealing can be suppressed, and therefore degradation of carrier mobility and degradation of transistor characteristics due to the degradation of the carrier mobility can be suppressed.

Thus, according to the semiconductor device of the present disclosure, the increase in EOT and the degradation of the carrier mobility can be suppressed while adding metal which can form an electric dipole for reducing the threshold voltage at an interface between the oxygen-containing insulating film on a surface of the semiconductor substrate and the high dielectric constant insulating film. Thus, the transistor characteristics can be improved.

In the semiconductor device of the present disclosure, the first region may be an N-type FET formation region, and the second metal may be lanthanum, dysprosium, scandium, erbium, or strontium. In such a manner, reduction in threshold voltage of an N-type FET can be ensured.

In the semiconductor device of the present disclosure, the second metal may exist also at the interface between the first high dielectric constant insulating film and the first oxygen-containing insulating film so that an electric dipole is formed at the interface to reduce threshold voltage to be applied to the first gate electrode.

In the semiconductor device of the present disclosure, the first oxygen-containing insulating film may be a silicon oxide film.

In the semiconductor device of the present disclosure, the first high dielectric constant insulating film may be any one of a hafnium oxide film, a hafnium silicon oxide film, a hafnium silicon oxynitride film, a zirconium oxide film, and a hafnium zirconium oxide film.

In the semiconductor device of the present disclosure, the first gate electrode may include a first metal-containing layer contacting the first high dielectric constant insulating film. In such a case, the first metal-containing layer may be a titanium nitride film, a tantalum nitride film, a tantalum carbide film, a tantalum carbide nitride film, or a multilayer film of two or more of these films.

In the semiconductor device of the present disclosure, the first region may be a P-type FET formation region, and the second metal may be aluminum. In such a manner, reduction in threshold voltage of a P-type FET can be ensured.

The semiconductor device of the present disclosure may further include a second gate insulating film formed on a second region of the semiconductor substrate; and a second gate electrode formed on the second gate insulating film. The second gate insulating film may include a second oxygen-containing insulating film and a second high dielectric constant insulating film formed on the second oxygen-containing insulating film and containing the first metal. The second high dielectric constant insulating film may further contain a third metal different from the first metal and the second metal. Part of the second high dielectric constant insulating film having a maximum composition ratio of the third metal may be away from an interface between the second high dielectric constant insulating film and the second oxygen-containing insulating film and an interface between the second high dielectric constant insulating film and the second gate electrode. In such a case, the third metal may exist also at the interface between the second high dielectric constant insulating film and the second oxygen-containing insulating film so that an electric dipole is formed at the interface to reduce threshold voltage to be applied to the second gate electrode. In addition, the second oxygen-containing insulating film may be a silicon oxide film. Further, the second high dielectric constant insulating film may be any one of a hafnium oxide film, a hafnium silicon oxide film, a hafnium silicon oxynitride film, a zirconium oxide film, and a hafnium zirconium oxide film. Furthermore, the second gate electrode may include a second metal-containing layer contacting the second high dielectric constant insulating film, and the second metal-containing layer may be a titanium nitride film, a tantalum nitride film, a tantalum carbide film, a tantalum carbide nitride film, or a multilayer film of two or more of these films.

A method for fabricating a semiconductor device of the present disclosure includes the steps of (a) sequentially forming an oxygen-containing insulating film, a lower high dielectric constant insulating film containing a first metal, a metal oxide film containing a second metal different from the first metal, and an upper high dielectric constant insulating film containing the first metal on a semiconductor substrate; and (b) forming a high dielectric constant insulating film by mixing the lower high dielectric constant insulating film, the metal oxide film, and the upper high dielectric constant insulating film under heat treatment.

According to the method for fabricating the semiconductor device of the present disclosure, a thickness of the high dielectric constant insulating film (i.e., the lower high dielectric constant insulating film) provided below the metal oxide film can be reduced as compared to a case where a metal oxide film such as a lanthanum oxide film or an aluminum oxide film is formed on a high dielectric constant insulating film. As a result, a thickness of the metal oxide film required for reducing threshold voltage, such as the lanthanum oxide film or the aluminum oxide film can be reduced, and therefore an increase in EOT of the entire gate insulating film (a multilayer body of the high dielectric constant insulating film, which is obtained by the heat treatment, and the oxygen-containing insulating film) and degradation of transistor characteristics due to the increase in EOT can be suppressed.

In addition, according to the method for fabricating the semiconductor device of the present disclosure, a thickness of the insulating film (a multilayer structure of the lower high dielectric constant insulating film and the oxygen-containing insulating film) provided below the metal oxide film can be increased as compared to a case where a metal oxide film such as a lanthanum oxide film or an aluminum oxide film is formed below a high dielectric constant insulating film. As a result, diffusion of, e.g., lanthanum atoms or aluminum atoms in the semiconductor substrate due to the heat treatment can be suppressed, and therefore degradation of carrier mobility and degradation of transistor characteristics due to the degradation of the carrier mobility can be suppressed.

Thus, according to the method for fabricating the semiconductor device of the present disclosure, the increase in EOT and the degradation of the carrier mobility can be suppressed while adding metal which can form an electric dipole for reducing the threshold voltage at an interface between the oxygen-containing insulating film on a surface of the semiconductor substrate and the high dielectric constant insulating film. Thus, the transistor characteristics can be improved.

In the method for fabricating the semiconductor device of the present disclosure, the lower high dielectric constant insulating film and the upper high dielectric constant insulating film may be insulating films of a same type.

The method for fabricating the semiconductor device of the present disclosure may further include the step of (c), after step (b), forming a gate electrode on the high dielectric constant insulating film.

In the method for fabricating the semiconductor device of the present disclosure, the second metal may be lanthanum, dysprosium, scandium, erbium, or strontium. In such a manner, reduction in threshold voltage of an N-type FET can be reduced.

In the method for fabricating the semiconductor device of the present disclosure, the second metal may be aluminum. In such a manner, reduction in threshold voltage of a P-type FET can be reduced.

In the method for fabricating the semiconductor device of the present disclosure, the step (b) may include a sub-step of performing the heat treatment at a temperature of equal to or higher than 500° C. and equal to or lower than 1350° C. in inert gas atmosphere or in vacuum.

The present disclosure relates to the semiconductor device and the method for fabricating the semiconductor device. In particular, the present disclosure is useful when the semiconductor device having the transistor using the high dielectric constant insulating film as the gate insulating film and the method for fabricating the semiconductor device are employed because the increase in EOT and the degradation of the carrier mobility can be suppressed while reducing the threshold voltage.

BRIEF DESCRIPTION OF THE DRAWINGS

FIGS. 6A-6D are cross-sectional views illustrating steps in the method for fabricating the semiconductor device of the second embodiment of the present disclosure.

DETAILED DESCRIPTION

First Embodiment

A semiconductor device of a first embodiment of the present disclosure and a method for fabricating the semiconductor device will be described below with reference to the drawings.

Figure 1A:
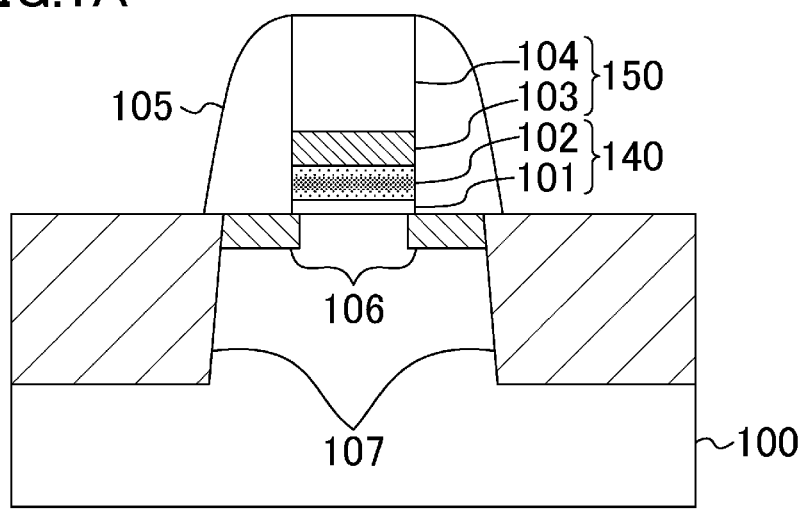
FIG. 1A is a cross-sectional view of a semiconductor device of a first embodiment of the present disclosure.

FIG. 1A is a cross-sectional view of the semiconductor device of the present embodiment. As illustrated in FIG. 1A, a gate electrode 150 is formed on an N-type FET formation region (first region of a semiconductor substrate 100, which is surrounded by an element isolation region) of the semiconductor substrate 100 which is, e.g., a silicon substrate with a gate insulating film 140 being interposed therebetween. The gate insulating film 140 includes an oxygen-containing insulating film 101 made of, e.g., a silicon oxide film ($SiO_2$ film) having a thickness of about 1 nm, and a high dielectric constant insulating film 102 formed on the oxygen-containing insulating film 101 and made of, e.g., a hafnium oxide film ($HfO_2$ film) having a thickness of about 2 nm. The gate electrode 150 includes a metal-containing layer (metal electrode) 103 contacting the high dielectric constant insulating film 102 and made of, e.g., a titanium nitride (TiN) film, and a polysilicon layer (polysilicon electrode) 104 formed on the metal-containing layer 103.

In addition, as illustrated in FIG. 1A, an insulating sidewall-spacer 105 is formed on a side surface of the gate electrode 150. Further, an N-type extension region 106 is formed below the sidewall-spacer 105 in a surface portion of the semiconductor substrate 100, and an N-type source/drain region 107 is formed in part of the surface portion of the semiconductor substrate 100 corresponding to an outside of the sidewall-spacer 105, i.e., a side opposite to the gate electrode 150 with respect to the sidewall-spacer 105.

A feature of the present embodiment is as follows. The high dielectric constant insulating film 102 contains metal material which can form an electric dipole for reducing threshold voltage at an interface between the oxygen-containing insulating film 101 and the high dielectric constant insulating film 102, such as lanthanum (La), and part of the high dielectric constant insulating film 102 having the maximum lanthanum composition ratio (concentration) is away from each of the interface between the oxygen-containing insulating film 101 and the high dielectric constant insulating film 102 and an interface between the high dielectric constant insulating film 102 and the gate electrode 150. That is, the lanthanum concentration is the maximum inside the high dielectric constant insulating film 102 (e.g., near a middle portion of the high dielectric constant insulating film 102 in a thickness direction thereof).

Figure 1B:
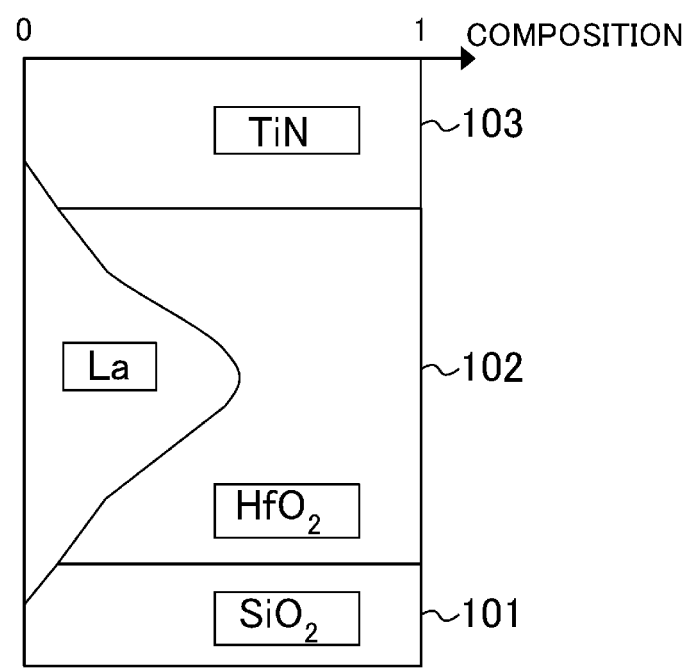
FIG. 1B is a diagram illustrating a composition distribution in a direction perpendicular to a principal surface of a substrate in a gate insulating film/gate electrode structure illustrated in FIG. 1A.

FIG. 1B illustrates a composition distribution in a direction perpendicular to a principal surface of the substrate in a gate insulating film/gate electrode structure (specifically a multilayer structure of the oxygen-containing insulating film 101, the high dielectric constant insulating film 102, and the metal-containing layer 103) illustrated in FIG. 1A. As described above, the high dielectric constant insulating film 102 of the present embodiment is a lanthanum-hafnium-mixed metal oxide film. As illustrated in FIG. 1B, the lanthanum concentration (La composition/(Hf composition+La composition+O composition)) in the high dielectric constant insulating film 102 is the maximum inside the high dielectric constant insulating film 102 (e.g., near the middle portion of the high dielectric constant insulating film 102 in the thickness direction thereof), and a value for the maximum lanthanum concentration is, e.g., 60%. The lanthanum concentration at the interface between the high dielectric constant insulating film 102 and the oxygen-containing insulating film 101 is, e.g., about 10%, and lanthanum is slightly contained at an interface between the high dielectric constant insulating film 102 and the metal-containing layer 103. On the other hand, in the present embodiment, lanthanum does not exist at an interface between the oxygen-containing insulating film 101 and the semiconductor substrate 100.

As described above, the present embodiment is characterized in that the metal material which can form the electric dipole for reducing the threshold voltage at the interface between the oxygen-containing insulating film 101 and the high dielectric constant insulating film 102 is added to the high dielectric constant insulating film 102, and the concentration of the metal material is the maximum inside the high dielectric constant insulating film 102. This reduces the threshold voltage while suppressing each of degradation of carrier mobility due to entering of lanthanum atoms into the semiconductor substrate 100 and an increase in EOT.

Specifically, lanthanum atoms are also distributed at the interface between the high dielectric constant insulating film 102 and the oxygen-containing insulating film 101. Consequently, the electric dipole can be formed at such an interface, thereby reducing the threshold voltage.

Figure 8A:
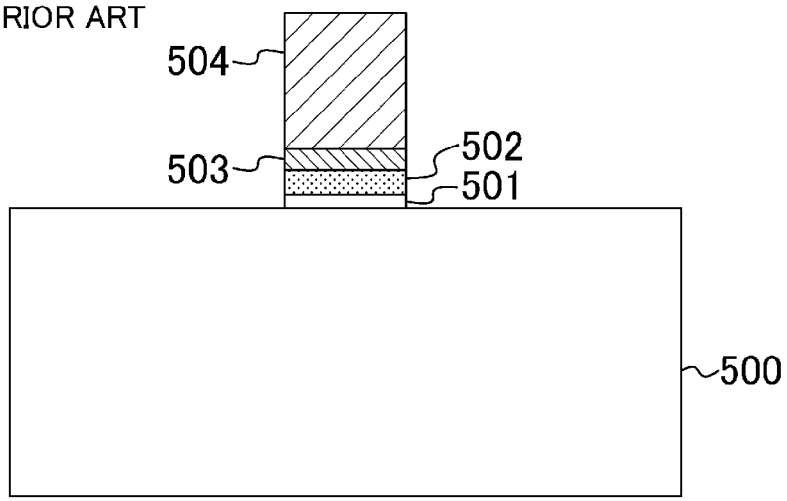
FIG. 8A is a cross-sectional view of a semiconductor device of a first conventional example.
Figure 8B:
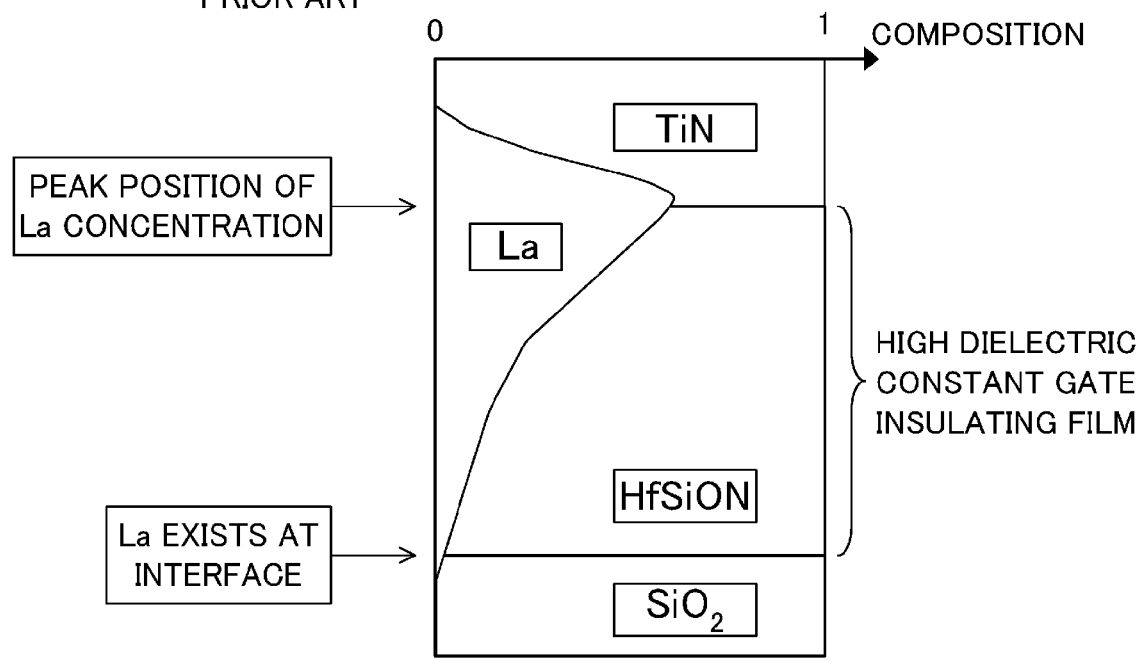
FIG. 8B is a diagram illustrating a composition distribution in a direction perpendicular to a principal surface of a substrate after annealing is performed for a gate insulating film/gate electrode structure illustrated in FIG. 8A.

Unlike a first conventional example illustrated in FIGS. 8A and 8B, i.e., a case where a lanthanum oxide film is formed on a high dielectric constant gate insulating film, a peak of a lanthanum concentration distribution is positioned inside the high dielectric constant insulating film 102, and therefore a distance from the peak position to the interface between the high dielectric constant insulating film 102 and the oxygen-containing insulating film 101 is shortened. In other words, in a case where the lanthanum oxide film for diffusing lanthanum atoms in the high dielectric constant insulating film 102 is thinner than that of the first conventional example, the threshold voltage can be reduced as much as in the first conventional example. Thus, an increase in EOT of the entire gate insulating film 140 and degradation of transistor characteristics due to the increase in EOT can be suppressed.

Figure 9A:
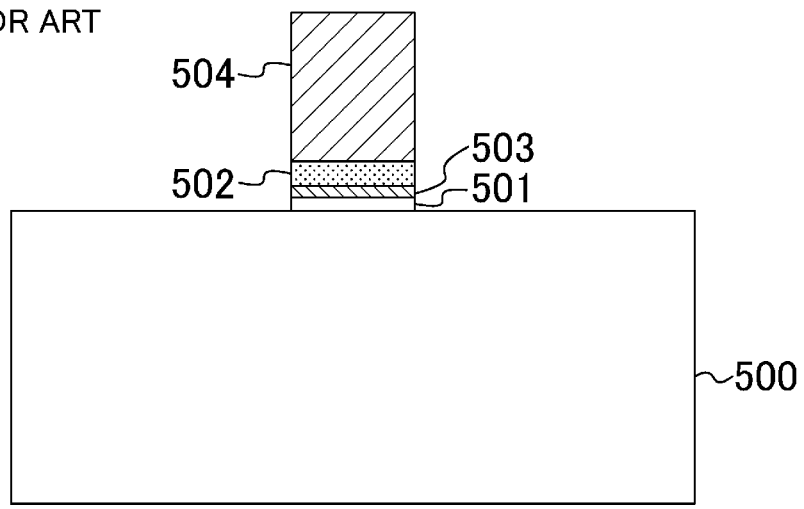
FIG. 9A is a cross-sectional view of a semiconductor device of a second conventional example.
Figure 9B:
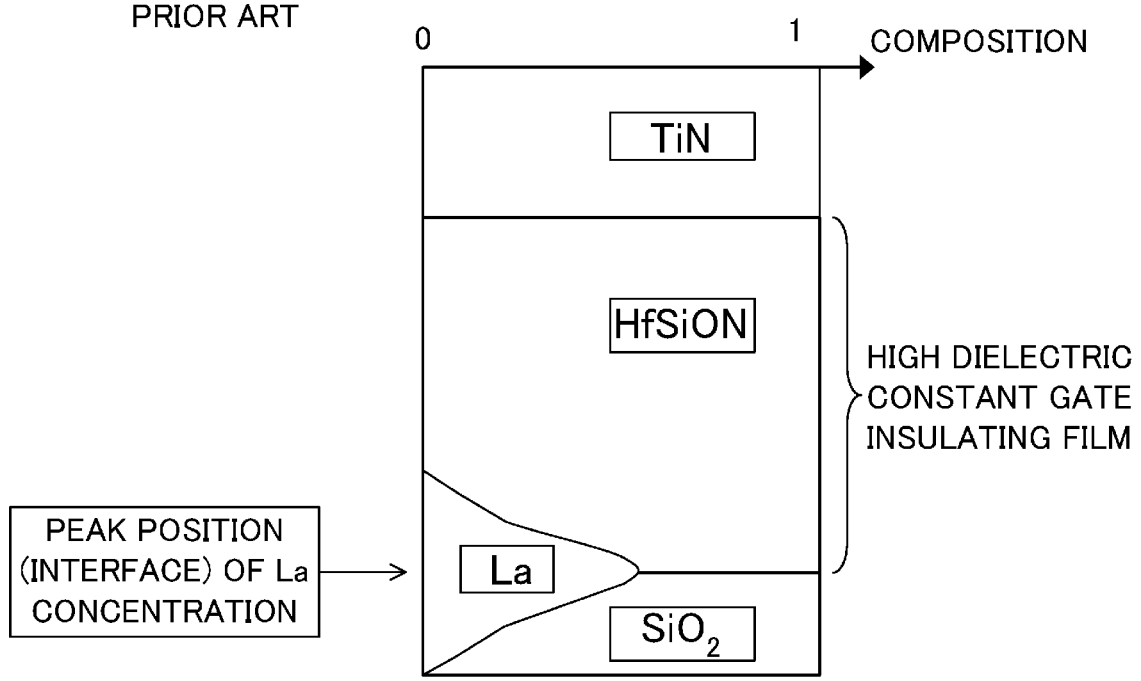
FIG. 9B is a diagram illustrating a composition distribution in a direction perpendicular to a principal surface of a substrate after annealing is performed for a gate insulating film/gate electrode structure illustrated in FIG. 9A.

Unlike a second conventional example illustrated in FIGS. 9A and 9B, i.e., a case where a lanthanum oxide film etc. are formed below a high dielectric constant gate insulating film, an end of a tail of the lanthanum concentration distribution can be positioned near the interface between the high dielectric constant insulating film 102 and the oxygen-containing insulating film 101. In other words, since diffusion of lanthanum atoms in the semiconductor substrate 100 due to heat treatment such as activation annealing can be suppressed, the degradation of the carrier mobility and the degradation of the transistor characteristics due to the degradation of the carrier mobility can be suppressed.

Note that, in the present embodiment, lanthanum is used as the metal material which can form the electric dipole for reducing the threshold voltage at the interface between the oxygen-containing insulating film 101 and the high dielectric constant insulating film 102, but the present disclosure is not limited to such a configuration. Other metal material which can vary the threshold voltage may be used. For example, in order to reduce threshold voltage of the N-type FET, dysprosium, scandium, erbium, strontium, etc. may be used.

In the present embodiment, the silicon (Si) substrate is used as the semiconductor substrate 100. However, e.g., a silicon germanium (SiGe) substrate or a germanium (Ge) substrate may be used instead of using the silicon substrate.

In the present embodiment, the silicon oxide film ($SiO_2$ film) is formed on the surface of the semiconductor substrate 100 as the oxygen-containing insulating film 101. However, a silicon oxynitride film (SiON film) may be formed instead of forming the silicon oxide film. If the SiGe substrate is used as the semiconductor substrate 100, e.g., a SiGeO film or a SiGeON film may be formed. If the Ge substrate is used as the semiconductor substrate 100, e.g., a $GeO_2$ film or a GeON film may be formed.

In the present embodiment, the hafnium oxide film is formed as the high dielectric constant insulating film 102. However, e.g., a hafnium silicon oxide film, a hafnium silicon oxynitride film, a zirconium oxide film, or a hafnium zirconium oxide film may be formed instead of forming the hafnium oxide film.

In the present embodiment, the gate electrode 150 includes the titanium nitride (TiN) film as the metal-containing layer 103 contacting the high dielectric constant insulating film 102. However, the gate electrode 150 may include, e.g., a tantalum nitride film, a tantalum carbide film, or a tantalum carbide nitride film instead of including the TiN film. Alternatively, the metal-containing layer 103 may be a multilayer body including two or more films selected from a titanium nitride film, a tantalum nitride film, a tantalum carbide film, and a tantalum carbide nitride film.

In the present embodiment, the maximum value for the lanthanum concentration inside the high dielectric constant insulating film 102 is set to about 60%, and the lanthanum concentration at the interface between the high dielectric constant insulating film 102 and the oxygen-containing insulating film 101 is set to about 10%. However, needless to say, as long as the lanthanum concentration is the maximum inside the high dielectric constant insulating film 102, and lanthanum exists at the interface between the high dielectric constant insulating film 102 and the oxygen-containing insulating film 101, the maximum value for the lanthanum concentration and the value for the lanthanum concentration at the interface between the high dielectric constant insulating film 102 and the oxygen-containing insulating film 101 are not limited.

In the present embodiment, a case where lanthanum is used to reduce the threshold voltage of the N-type FET has been described. However, threshold voltage of a P-type FET can be controlled in the similar manner instead of controlling the threshold voltage of the N-type FET. Specifically, e.g., aluminum may be used as metal material for reducing the threshold voltage of the P-type FET.

The present embodiment is intended for the planar type FET. However, even if the present embodiment is intended for, e.g., an FET having a damascene gate structure or a FinFET instead of the planar type FET, the similar advantages can be realized.

The method for fabricating the semiconductor device of the first embodiment of the present disclosure will be described below with reference to FIGS. 2A-2D and 3A-3C as an example of a method for fabricating the N-type FET. FIGS. 2A-2D and 3A-3C are cross-sectional views illustrating steps in the method for fabricating the semiconductor device of the present embodiment. Note that, in FIGS. 2A-2D and 3A-3C, the same reference numerals as those shown in the semiconductor device of the present embodiment illustrated in FIG. 1A are used to represent equivalent elements.

Figure 2A:
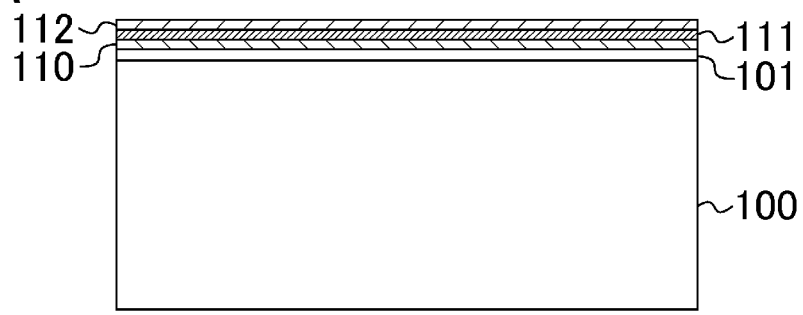
FIGS. 2A-2D are cross-sectional views illustrating steps in a method for fabricating the semiconductor device of the first embodiment of the present disclosure.

First, as illustrated in FIG. 2A, an oxygen-containing insulating film 101 made of, e.g., a silicon oxide film ($SiO_2$ film) having a thickness of about 1 nm is formed on a semiconductor substrate 100 having a P-type well. Then, a lower high dielectric constant insulating film 110 made of, e.g., a hafnium oxide film ($HfO_2$ film) having a thickness of about 1 nm, a metal oxide film 111 made of, e.g., a lanthanum oxide film having a thickness of about 0.5 nm, and an upper high dielectric constant insulating film 112 made of, e.g., a hafnium oxide film ($HfO_2$ film) having a thickness of about 1 nm are sequentially stacked on the oxygen-containing insulating film 101.

Figure 2B:
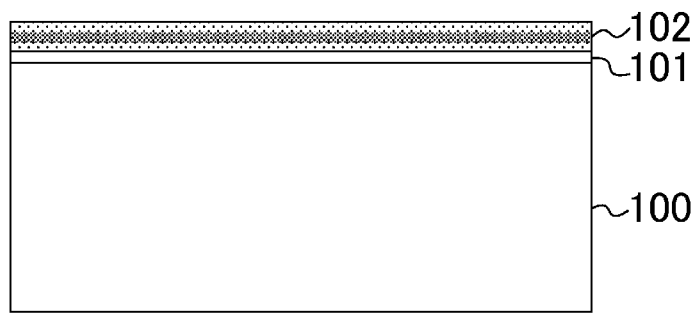

Subsequently, as illustrated in FIG. 2B, by performing annealing at a temperature of, e.g., about 800° C. in, e.g., nitrogen atmosphere, the lower high dielectric constant insulating film 110, the metal oxide film 111, and the upper high dielectric constant insulating film 112 are mixed to form a high dielectric constant insulating film 102. A lanthanum concentration in a middle portion of the high dielectric constant insulating film 102 is higher as compared to a lanthanum concentration in upper and lower portions of the high dielectric constant insulating film 102.

Figure 2C:
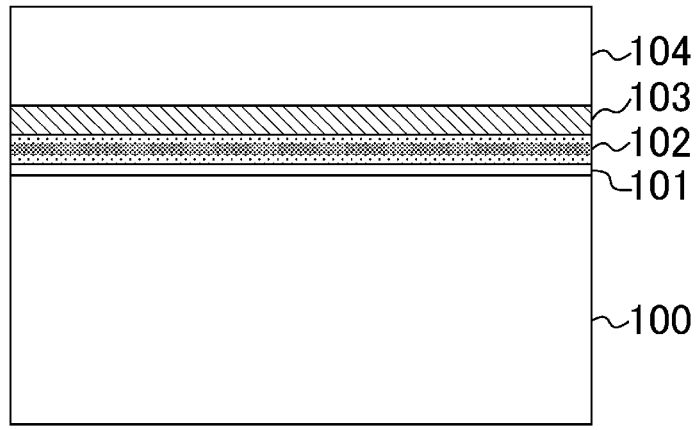

Subsequently, as illustrated in FIG. 2C, a metal-containing layer 103 made of, e.g., a titanium nitride film having a thickness of about 10 nm and a polysilicon layer 104 having a thickness of, e.g., about 100 nm are sequentially stacked on the high dielectric constant insulating film 102.

Figure 2D:
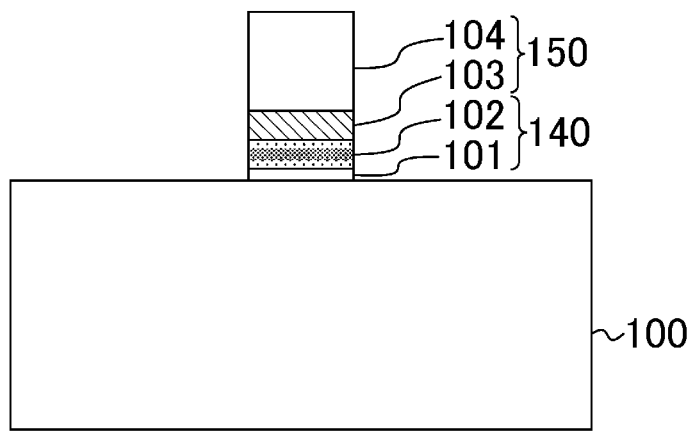

Subsequently, as illustrated in FIG. 2D, dry etching is sequentially performed for the polysilicon layer 104 and the metal-containing layer 103 by using a resist pattern (not shown in the figure) covering a gate electrode formation region as a mask, thereby forming a gate electrode 150 having a gate length of, e.g., about 50 nm. At this point, part of the high dielectric constant insulating film 102 and the oxygen-containing insulating film 101 corresponding to an outside of the gate electrode 150 is also removed by the etching, thereby forming a gate insulating film 140 including the oxygen-containing insulating film 101 and the high dielectric constant insulating film 102 below the gate electrode 150.

Figure 3A:
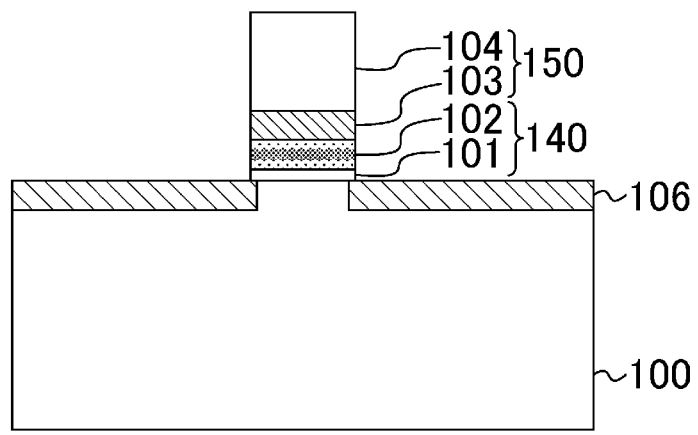
FIGS. 3A-3C are cross-sectional views illustrating steps in the method for fabricating the semiconductor device of the first embodiment of the present disclosure.

Subsequently, as illustrated in FIG. 3A, ion implantation is performed to implant, e.g., arsenic to the semiconductor substrate 100 as an implantation impurity by using the gate electrode 150 as a mask, thereby forming an N-type extension region 106. At this point, conditions for the ion implantation are as follows: acceleration energy is 2 keV, and an implantation impurity dose amount is $1 \times 10^{15}$ atoms/cm$^2$.

Figure 3B:
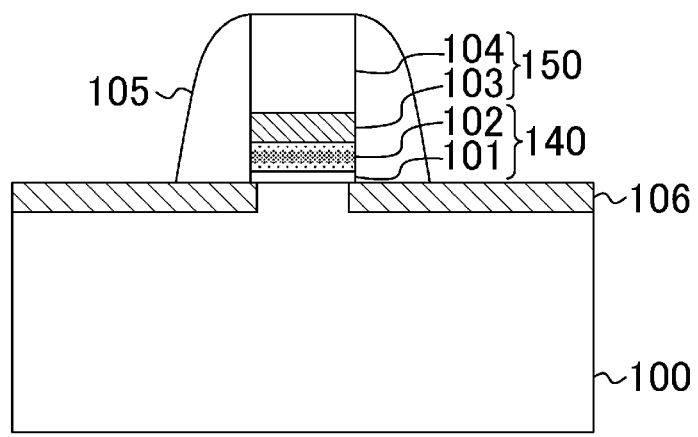

Subsequently, a silicon oxide film having a thickness of, e.g., about 70 nm is stacked on an entire surface of the semiconductor substrate 100. Then, by etching-back the silicon oxide film, a sidewall-spacer 105 having a width of, e.g., about 70 nm is formed on the side surface of the gate electrode 150 as illustrated in FIG. 3B.

Figure 3C:
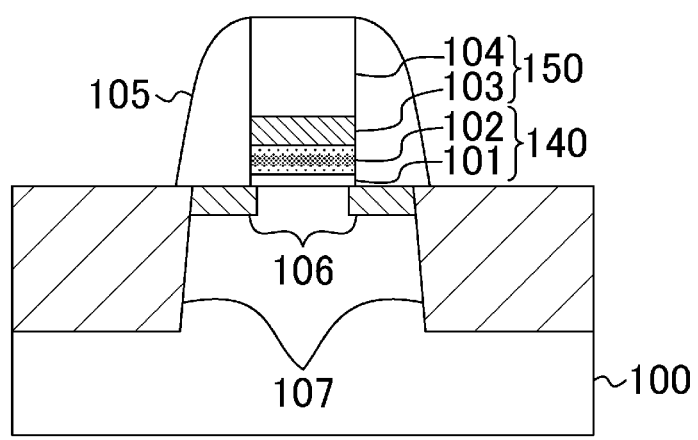

Subsequently, as illustrated in FIG. 3C, the ion implantation is performed to implant, e.g., arsenic to the semiconductor substrate 100 as the implantation impurity by using the gate electrode 150 and the sidewall-spacer 105 as a mask, thereby forming an N-type source/drain region 107. At this point, the conditions for the ion implantation are as follows: the acceleration energy is 20 keV, and the implantation impurity dose amount is $4 \times 10^{15}$ atoms/cm$^2$.

Subsequently, in order to activate the impurity implanted to the extension region 106 and the source/drain region 107, activation annealing is performed under spike conditions of, e.g., 1000° C. and 0 second.

As described above, in the present embodiment, a structure is formed, in which the metal oxide film 111 made of the lanthanum oxide film is sandwiched between the lower high dielectric constant insulating film 110 and the upper high dielectric constant insulating film 112 which are made of the hafnium oxide film. Then, the annealing is performed to form the high dielectric constant insulating film (lanthanum-containing high dielectric constant insulating film) 102 having the high lanthanum concentration in the middle portion thereof, on the oxygen-containing insulating film 101. This solves the problems of the conventional method, i.e., suppresses the degradation of the transistor characteristics due to, e.g., the degradation of the carrier mobility caused by the entering of lanthanum into the silicon substrate and the increase in EOT.

Note that the method intended for the N-type FET has been described above, but the similar method can be used for the P-type FET. However, if the method is intended for the P-type FET, e.g., an aluminum oxide film may be used as the metal oxide film 111 instead of using the lanthanum oxide film. If the method is intended for the N-type FET, e.g., a dysprosium oxide film, a scandium oxide film, an erbium oxide film, or a strontium oxide film may be used as the metal oxide film 111 instead of using the lanthanum oxide film.

In the present embodiment, a single structure is formed, in which the metal oxide film 111 is sandwiched between the lower high dielectric constant insulating film 110 and the upper high dielectric constant insulating film 112. However, two or more of the foregoing structures may be formed. In other words, after the upper high dielectric constant insulating film 112 is formed at the step illustrated in FIG. 2A, a metal oxide film and a high dielectric constant insulating film may be alternately formed in this order. In such a case, an uppermost high dielectric constant insulating film may not be formed.

In the present embodiment, in order to form the high dielectric constant insulating film 102 by mixing the lower high dielectric constant insulating film 110, the metal oxide film 111, and the upper high dielectric constant insulating film 112, the annealing is performed after the step of stacking the upper high dielectric constant insulating film 112 (see FIG. 2A) and before the step of stacking the metal-containing layer 103 (titanium nitride film) (see FIG. 2C). However, timing to perform the annealing is not limited as long as the annealing is performed after the step of stacking the upper high dielectric constant insulating film 112. For example, the annealing may be performed right after the step of stacking the metal-containing layer 103 or the polysilicon layer 104, or the annealing may be performed as the activation annealing of the impurity implanted to the source/drain region 107. In addition, the annealing for mixing the lower high dielectric constant insulating film 110, the metal oxide film 111, and the upper high dielectric constant insulating film 112 to form the high dielectric constant insulating film 102 is performed at the temperature of about 800° C. in the nitrogen atmosphere, but the present disclosure is not limited to such a configuration. The annealing may be performed at a temperature of equal to or higher than 500° C. and equal to or lower than 1350° C. in inert gas atmosphere or vacuum.

In the present embodiment, the same hafnium oxide film is used as the lower high dielectric constant insulating film 110 and the upper high dielectric constant insulating film 112. However, different types of insulating films may be used as the lower high dielectric constant insulating film 110 and the upper high dielectric constant insulating film 112.

In the present embodiment, the following films are used: the silicon oxide film used as the oxygen-containing insulating film 101; the hafnium oxide film used as the lower high dielectric constant insulating film 110 and the upper high dielectric constant insulating film 112; the lanthanum oxide film used as the metal oxide film 111; and the titanium nitride film used as the metal-containing layer 103 (metal electrode). However, the foregoing has been set forth merely as an example. Needless to say, other alternative materials realizing the similar advantages may be used.

Needless to say, in the present embodiment, a silicide layer made of, e.g., nickel silicide may be provided in each of a surface portion of the polysilicon layer 104 forming an upper portion of the gate electrode 150 and a surface portion of the source/drain region 107.

Second Embodiment

A semiconductor device of a second embodiment of the present disclosure and a method for fabricating the semiconductor device will be described below with reference to the drawings. Note that the present embodiment is intended for the semiconductor device including a gate insulating film having a high dielectric constant insulating film similar to that of the first embodiment (i.e., a high dielectric constant insulating film containing metal material which can form an electric dipole for reducing threshold voltage at an interface between an oxygen-containing insulating film on a substrate surface and the high dielectric constant insulating film and having the maximum concentration of the metal material inside the high dielectric constant insulating film) in both of an N-type FET and a P-type FET.

Figure 4:
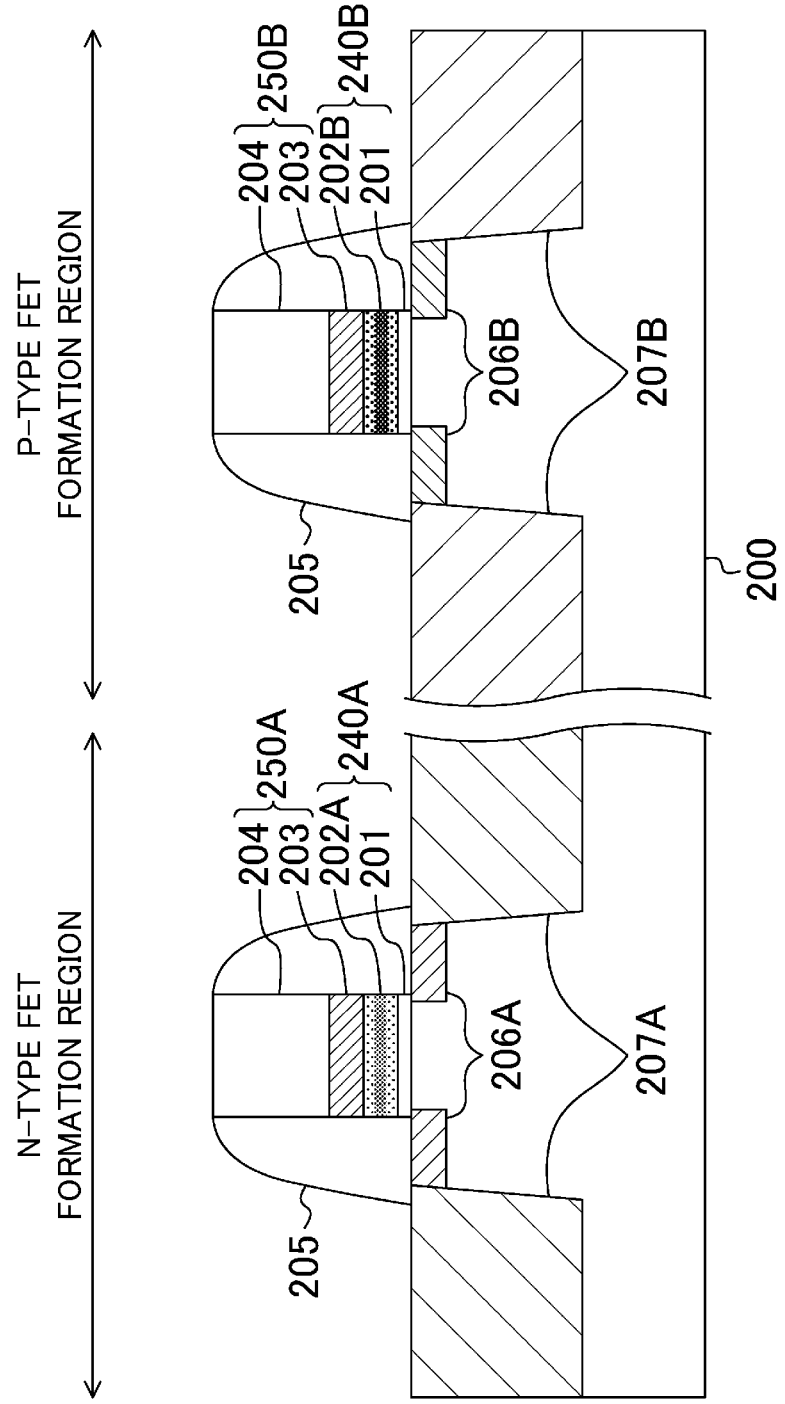
FIG. 4 is a cross-sectional view of a semiconductor device of a second embodiment of the present disclosure.

FIG. 4 is a cross-sectional view of the semiconductor device of the present embodiment. As illustrated in FIG. 4, a gate electrode 250A is formed on an N-type FET formation region (first region of a semiconductor substrate 200, which is surrounded by an element isolation region) of the semiconductor substrate 200 which is, e.g., a silicon substrate with a gate insulating film 240A being interposed therebetween. In addition, a gate electrode 250B is formed on a P-type FET formation region (second region of the semiconductor substrate 200, which is surrounded by the element isolation region) of the semiconductor substrate 200 with a gate insulating film 240B being interposed therebetween. The gate insulating film 240A includes an oxygen-containing insulating film 201 made of, e.g., a silicon oxide film ($SiO_2$ film) having a thickness of about 1 nm, and a high dielectric constant insulating film 202A formed on the oxygen-containing insulating film 201 and made of, e.g., a hafnium oxide film ($HfO_2$ film) having a thickness of about 2 nm. The gate insulating film 240B includes an oxygen-containing insulating film 201 similar to that of the gate insulating film 240A, and a high dielectric constant insulating film 202B formed on the oxygen-containing insulating film 201 and made of, e.g., a hafnium oxide film ($HfO_2$ film) having a thickness of about 2 nm. Each of the gate electrodes 250A, 250B includes a metal-containing layer (metal electrode) 203 contacting the high dielectric constant insulating film 202A, 202B and made of, e.g., a titanium nitride (TiN) film, and a polysilicon layer (polysilicon electrode) 204 formed on the metal-containing layer 203.

As illustrated in FIG. 4, an insulating sidewall-spacer 205 is formed on each of side surfaces of the gate electrodes 250A, 250B. An N-type extension region 206A is formed in part of a surface portion of the semiconductor substrate 200 below the sidewall-spacer 205 provided on the side surface of the gate electrode 250A. In addition, an N-type source/drain region 207A is formed in part of the surface portion of the semiconductor substrate 200 corresponding to an outside of the sidewall-spacer 205, i.e., a side opposite to the gate electrode 250A with respect to the sidewall-spacer 205. A P-type extension region 206B is formed in part of the surface portion of the semiconductor substrate 200 below the sidewall-spacer 205 provided on the side surface of the gate electrode 250B. In addition, a P-type source/drain region 207B is formed in part of the surface portion of the semiconductor substrate 200 corresponding to an outside of the sidewall-spacer 205, i.e., a side opposite to the gate electrode 250B with respect to the sidewall-spacer 205.

A first feature of the present embodiment is as follows. The high dielectric constant insulating film 202A contains metal material which can form an electric dipole for reducing threshold voltage at an interface between the oxygen-containing insulating film 201 and the high dielectric constant insulating film 202A, such as lanthanum (La), and part of the high dielectric constant insulating film 202A having the maximum lanthanum composition ratio (concentration) is away from each of the interface between the oxygen-containing insulating film 201 and the high dielectric constant insulating film 202A and an interface between the high dielectric constant insulating film 202A and the gate electrode 250A. That is, the lanthanum concentration is the maximum inside the high dielectric constant insulating film 202A (e.g., near a middle portion of the high dielectric constant insulating film 202A in a thickness direction thereof). Lanthanum is contained at the interface between the high dielectric constant insulating film 202A and the oxygen-containing insulating film 201 and the interface between the high dielectric constant insulating film 202A and the gate electrode 250A (metal-containing layer 203), and, on the other hand, does not exist at an interface between the gate insulating film 240A (oxygen-containing insulating film 201) and the semiconductor substrate 200.

A second feature of the present embodiment is as follows. The high dielectric constant insulating film 202B contains metal material which can form an electric dipole for reducing threshold voltage at an interface between the oxygen-containing insulating film 201 and the high dielectric constant insulating film 202B, such as aluminum (Al), and part of the high dielectric constant insulating film 202B having the maximum aluminum composition ratio (concentration) is away from each of the interface between the oxygen-containing insulating film 201 and the high dielectric constant insulating film 202B and an interface between the high dielectric constant insulating film 202B and the gate electrode 250B. That is, the aluminum concentration is the maximum inside the high dielectric constant insulating film 202B (e.g., near a middle portion of the high dielectric constant insulating film 202B in a thickness direction thereof). Aluminum is contained at the interface between the high dielectric constant insulating film 202B and the oxygen-containing insulating film 201 and the interface between the high dielectric constant insulating film 202B and the gate electrode 250B (metal-containing layer 203), and, on the other hand, does not exist at an interface between the gate insulating film 240B (oxygen-containing insulating film 201) and the semiconductor substrate 200.

As described above, the present embodiment is characterized in that the metal material which can form the electric dipole for reducing the threshold voltage at the interface between each of the high dielectric constant insulating films 202A, 202B and the oxygen-containing insulating film 201 is added to the high dielectric constant insulating films 202A, 202B, and the concentration of the metal material is the maximum inside the high dielectric constant insulating films 202A, 202B. This reduces the threshold voltage while suppressing each of degradation of carrier mobility due to entering of lanthanum atoms or aluminum atoms into the semiconductor substrate 200 and an increase in EOT.

Specifically, lanthanum atoms or aluminum atoms are also distributed at the interface between each of the high dielectric constant insulating films 202A, 202B and the oxygen-containing insulating film 201. Consequently, the electric dipole can be formed at such an interface, thereby reducing the threshold voltage.

Unlike the first conventional example illustrated in FIGS. 8A and 8B, i.e., the case where the lanthanum oxide film is formed on the high dielectric constant gate insulating film, a peak of a lanthanum concentration distribution or an aluminum concentration distribution is positioned inside the high dielectric constant insulating films 202A, 202B, and therefore a distance from the peak position to the interface between each of the high dielectric constant insulating films 202A, 202B and the oxygen-containing insulating film 201 is shortened. In other words, in a case where a lanthanum oxide film or an aluminum oxide film for diffusing lanthanum atoms or aluminum atoms in the high dielectric constant insulating films 202A, 202B is thinner than that of the first conventional example, the threshold voltage can be reduced as much as in the first conventional example. Thus, an increase in EOT of the entire gate insulating film 240A, 240B and degradation of transistor characteristics due to the increase in EOT can be suppressed.

Unlike the second conventional example illustrated in FIGS. 9A and 9B, i.e., the case where the lanthanum oxide film etc. are formed below the high dielectric constant gate insulating film, an end of a tail of the lanthanum concentration distribution or the aluminum concentration distribution can be positioned near the interface between each of the high dielectric constant insulating films 202A, 202B and the oxygen-containing insulating film 201. In other words, since diffusion of lanthanum atoms or aluminum atoms in the semiconductor substrate 200 due to heat treatment such as activation annealing can be suppressed, the degradation of the carrier mobility and the degradation of the transistor characteristics due to the degradation of the carrier mobility can be suppressed.

Note that, in the present embodiment, lanthanum is used as the metal material which can form the electric dipole for reducing the threshold voltage at the interface between the high dielectric constant insulating film 202A and the oxygen-containing insulating film 201 which form the gate insulating film 240A of the N-type FET, but the present disclosure is not limited to such a configuration. Other metal material which can vary the threshold voltage, such as dysprosium, scandium, erbium, or strontium may be used.

In the present embodiment, aluminum is used as the metal material which can form the electric dipole for reducing the threshold voltage at the interface between the high dielectric constant insulating film 202B and the oxygen-containing insulating film 201 which form the gate insulating film 240B of the P-type FET, but the present disclosure is not limited to such a configuration. Other metal material which can vary the threshold voltage may be used.

In the present embodiment, the silicon (Si) substrate is used as the semiconductor substrate 200. However, e.g., a silicon germanium (SiGe) substrate or a germanium (Ge) substrate may be used instead of using the silicon substrate.

In the present embodiment, the silicon oxide film ($SiO_2$ film) is formed on a surface of the semiconductor substrate 200 as the oxygen-containing insulating film 201. However, a silicon oxynitride film (SiON film) may be formed instead of forming the silicon oxide film. If the SiGe substrate is used as the semiconductor substrate 200, e.g., a SiGeO film or a SiGeON film may be formed. If the Ge substrate is used as the semiconductor substrate 200, e.g., a $GeO_2$ film or a GeON film may be formed.

In the present embodiment, the hafnium oxide film is formed as the high dielectric constant insulating films 202A, 202B. However, e.g., a hafnium silicon oxide film, a hafnium silicon oxynitride film, a zirconium oxide film, or a hafnium zirconium oxide film may be formed instead of forming the hafnium oxide film.

In the present embodiment, each of the gate electrodes 250A, 250B includes the titanium nitride (TiN) film as the metal-containing layer 203 contacting the high dielectric constant insulating film 202A, 202B. However, each of the gate electrodes 250A, 250B may include, e.g., a tantalum nitride film, a tantalum carbide film, or a tantalum carbide nitride film instead of including the TiN film. Alternatively, the metal-containing layer 203 may be a multilayer body including two or more films selected from a titanium nitride film, a tantalum nitride film, a tantalum carbide film, and a tantalum carbide nitride film.

The present embodiment is intended for the planar type FET. However, even if the present embodiment is intended for, e.g., an FET having a damascene gate structure or a FinFET instead of the planar type FET, the similar advantages can be realized.

The method for fabricating the semiconductor device of the second embodiment of the present disclosure will be described below with reference to FIGS. 5A-5D, 6A-6D, and 7A-7C. FIGS. 5A-5D, 6A-6D, and 7A-7C are cross-sectional views illustrating steps in the method for fabricating the semiconductor device of the present embodiment. Note that, in the FIGS. 5A-5D, 6A-6D, and 7A-7C, the same reference numerals as those shown in the semiconductor device of the present embodiment illustrated in FIG. 4 are used to represent equivalent elements.

Figure 5A:
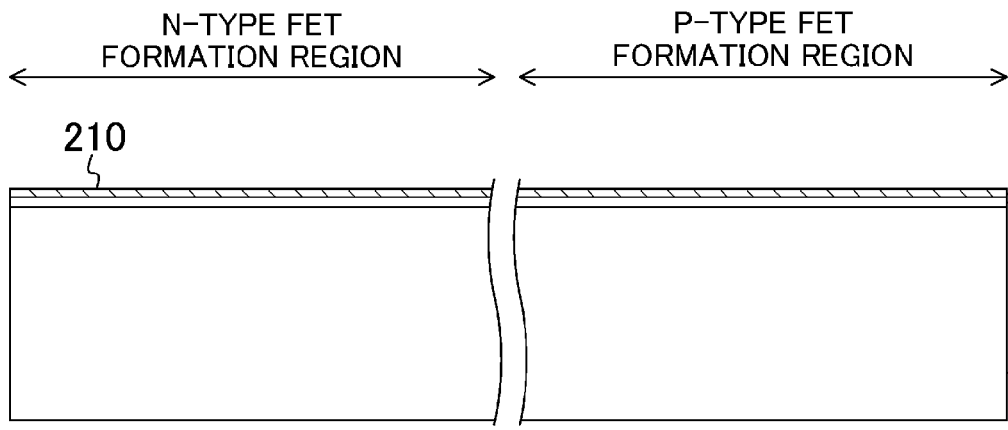
FIGS. 5A-5D are cross-sectional views illustrating steps in a method for fabricating the semiconductor device of the second embodiment of the present disclosure.

First, as illustrated in FIG. 5A, an oxygen-containing insulating film 201 made of, e.g., a silicon oxide film ($SiO_2$ film) having a thickness of about 1 nm is formed on a semiconductor substrate 200 including a P-type well in an N-type FET formation region and an N-type well in a P-type FET formation region. Then, a lower high dielectric constant insulating film 210 made of, e.g., a hafnium oxide film ($HfO_2$ film) having a thickness of about 1 nm is formed on the oxygen-containing insulating film 201.

Figure 5B:
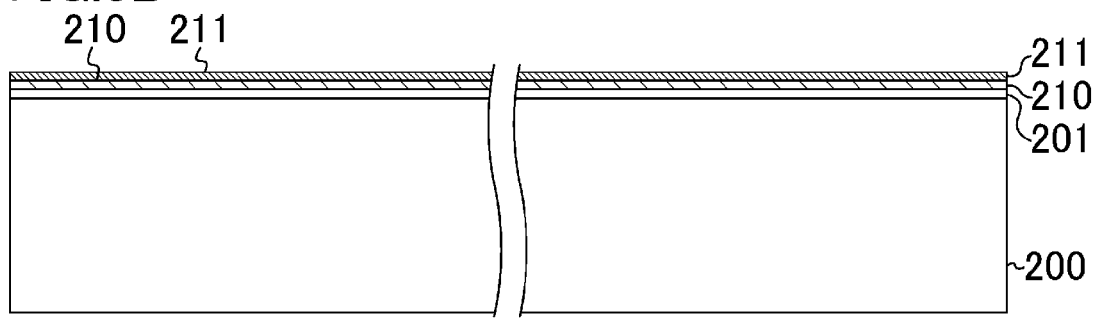
Figure 5C:
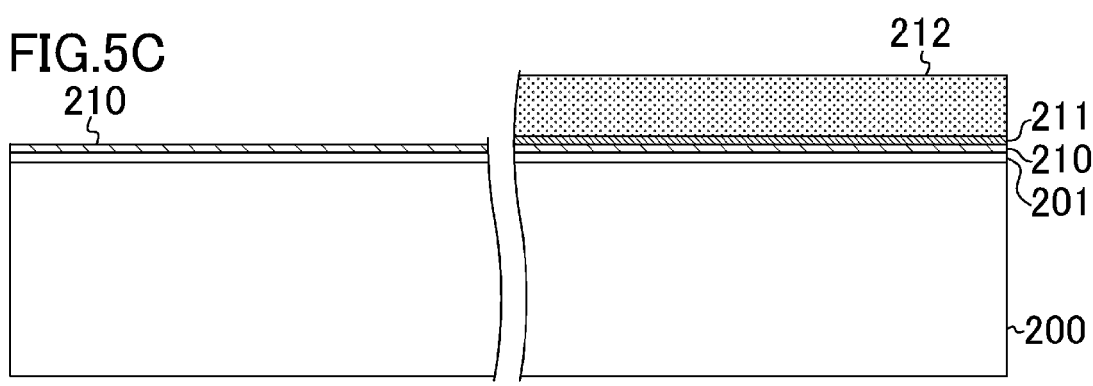

Subsequently, as illustrated in FIG. 5B, a first metal oxide film 211 made of, e.g., an aluminum oxide film having a thickness of about 0.5 nm is formed on the lower high dielectric constant insulating film 210. Then, as illustrated in FIG. 5C, the first metal oxide film 211 of the N-type FET formation region is selectively removed with a chemical solution such as tetramethylammonium hydroxide (TMAH) by using a resist pattern 212 covering the P-type FET formation region as a mask. Note that TMAH is a chemical solution typically used as developer, and the first metal oxide film 211 of the N-type FET formation region may be removed when processing using developer is performed in resist patterning.

Figure 5D:
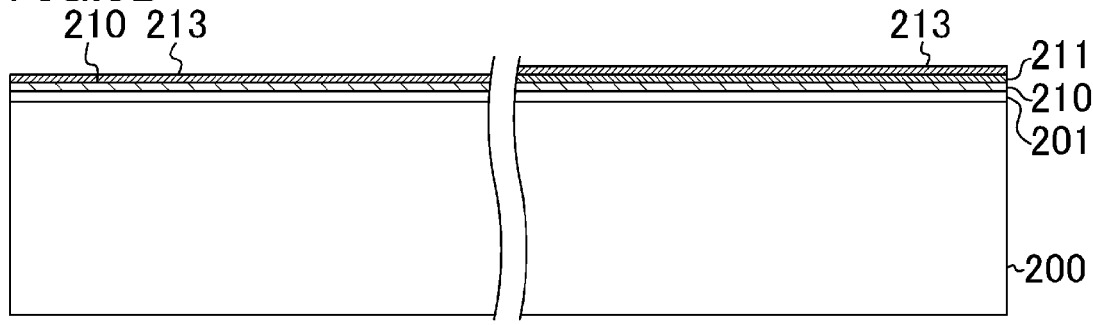

Subsequently, as illustrated in FIG. 5D, after the resist pattern 212 is removed, a second metal oxide film 213 made of, e.g., a lanthanum oxide film having a thickness of about 0.5 nm is formed on the lower high dielectric constant insulating film 210 of the N-type FET formation region and the first metal oxide film 211 of the P-type FET formation region.

Subsequently, as illustrated in FIG. 6A, the second metal oxide film 213 of the P-type FET formation region is selectively removed with a chemical solution such as hydrochloric acid by using a resist pattern 214 covering the N-type FET formation region as a mask.

Subsequently, as illustrated in FIG. 6B, after the resist pattern 214 is removed, an upper high dielectric constant insulating film 215 made of, e.g., a hafnium oxide film ($HfO_2$ film) having a thickness of about 1 nm is formed on the second metal oxide film 213 of the N-type FET formation region and the first metal oxide film 211 of the P-type FET formation region.

Subsequently, as illustrated in FIG. 6C, by performing annealing at a temperature of, e.g., about 800° C. in, e.g., nitrogen atmosphere, the lower high dielectric constant insulating film 210, the second metal oxide film 213, and the upper high dielectric constant insulating film 215 are mixed in the N-type FET formation region to form a high dielectric constant insulating film 202A. In addition, the lower high dielectric constant insulating film 210, the first metal oxide film 211, and the upper high dielectric constant insulating film 215 are mixed in the P-type FET formation region to form a high dielectric constant insulating film 202B. In the N-type FET formation region, a lanthanum concentration in a middle portion of the high dielectric constant insulating film 202A is higher as compared to a lanthanum concentration in upper and lower portions of the high dielectric constant insulating film 202A. In the P-type FET formation region, an aluminum concentration in a middle portion of the high dielectric constant insulating film 202B is higher as compared to an aluminum concentration in upper and lower portions of the high dielectric constant insulating film 202B.

Subsequently, as illustrated in FIG. 6D, a metal-containing layer 203 made of, e.g., a titanium nitride film having a thickness of about 10 nm, and a polysilicon layer 204 having a thickness of, e.g., about 100 nm are sequentially stacked on each of the high dielectric constant insulating films 202A, 202B. Then, dry etching is sequentially performed for the polysilicon layer 204 and the metal-containing layer 203 by using a resist pattern (not shown in the figure) covering a gate electrode formation region of each of the N-type FET and the P-type FET as a mask. In such a manner, gate electrodes 250A, 250B each having a gate length of, e.g., about 50 nm are formed in the N-type FET formation region and the P-type FET formation region, respectively. Part of the high dielectric constant insulating film 202A and the oxygen-containing insulating film 201 outside the gate electrode 250A is also removed by the etching, thereby forming a gate insulating film 240A including the oxygen-containing insulating film 201 and the high dielectric constant insulating film 202A below the gate electrode 250A. In addition, part of the high dielectric constant insulating film 202B and the oxygen-containing insulating film 201 outside the gate electrode 250B is also removed by the etching, thereby forming a gate insulating film 240B including the oxygen-containing insulating film 201 and the high dielectric constant insulating film 202B below the gate electrode 250B.

Figure 7A:
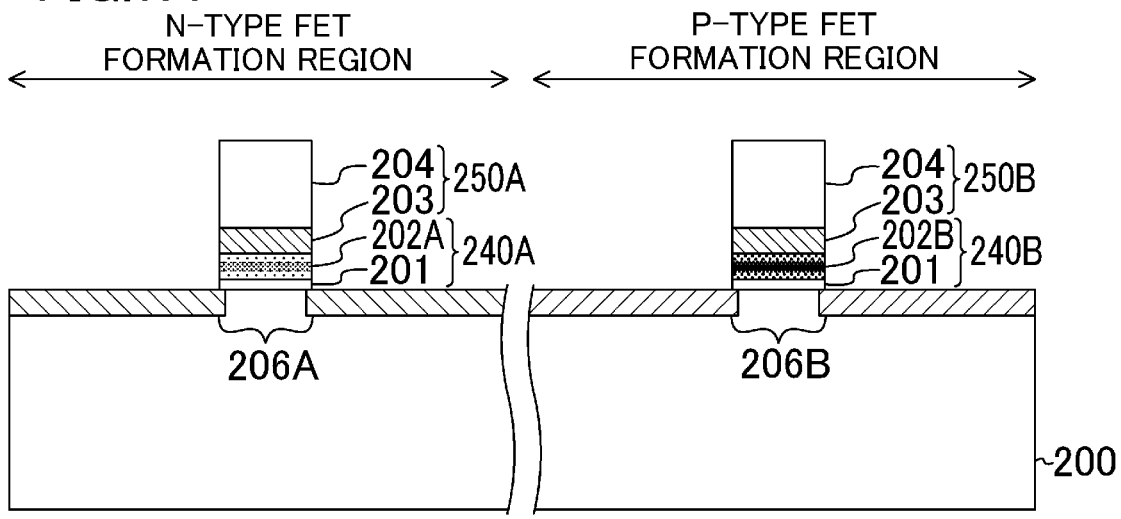
FIGS. 7A-7C are cross-sectional views illustrating steps in the method for fabricating the semiconductor device of the second embodiment of the present disclosure.

Subsequently, as illustrated in FIG. 7A, ion implantation is performed to implant, e.g., arsenic to the semiconductor substrate 200 as an implantation impurity by using a resist pattern (not shown in the figure) covering the P-type FET formation region and the gate electrode 250A as a mask, thereby forming an N-type extension region 206A. At this point, conditions for the ion implantation are as follows: acceleration energy is 2 keV, and an implantation impurity dose amount is $1 \times 10^{15}$ atoms/cm$^2$. In addition, the ion implantation is performed to implant, e.g., boron to the semiconductor substrate 200 as the implantation impurity by using a resist pattern (not shown in the figure) covering the N-type FET formation region and the gate electrode 250B as a mask, thereby forming a P-type extension region 206B. At this point, the conditions for the ion implantation are as follows: the acceleration energy is 0.3 keV, and the implantation impurity dose amount is $5 \times 10^{14}$ atoms/cm$^2$.

Figure 7B:
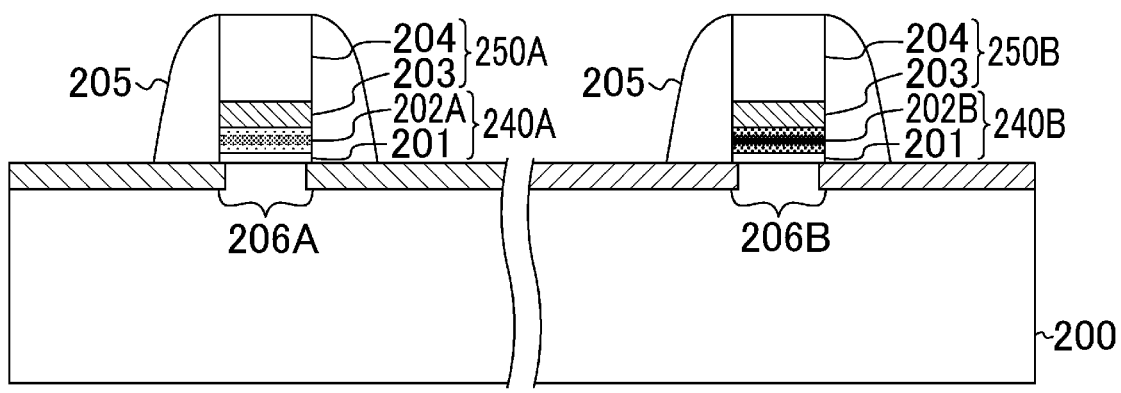

Subsequently, a silicon oxide film having a thickness of, e.g., about 70 nm is stacked on an entire surface of the semiconductor substrate 200. Then, by etching-back the silicon oxide film, a sidewall-spacer 205 having a width of, e.g., about 70 nm is formed on each of the side surfaces of the gate electrodes 250A, 250B as illustrated in FIG. 7B.

Figure 7C:
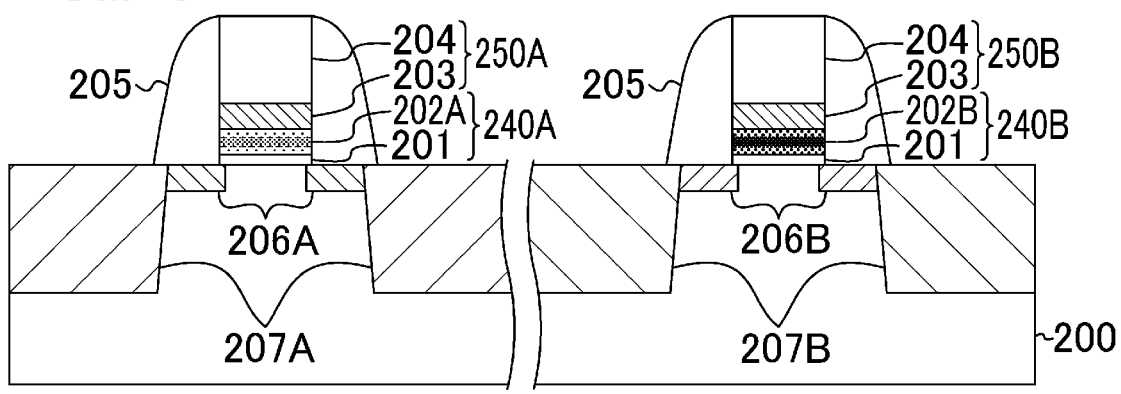

Subsequently, as illustrated in FIG. 7C, the ion implantation is performed to implant, e.g., arsenic to the semiconductor substrate 200 as the implantation impurity by using the resist pattern (not shown in the figure) covering the P-type FET formation region, the gate electrode 250A, and the sidewall-spacer 205 provided around the gate electrode 250A as a mask, thereby forming an N-type source/drain region 207A. At this point, the conditions for the ion implantation are as follows: the acceleration energy is 20 keV, and the implantation impurity dose amount is $4 \times 10^{15}$ atoms/cm$^2$. In addition, the ion implantation is performed to implant, e.g., boron to the semiconductor substrate 200 as the implantation impurity by using the resist pattern (not shown in the figure) covering the N-type FET formation region, the gate electrode 250B, and the sidewall-spacer 205 provided around the gate electrode 250B as a mask, thereby forming a P-type source/drain region 207B. At this point, the conditions for the ion implantation are as follows: the acceleration energy is 1.5 keV, and the implantation impurity dose amount is $4 \times 10^{15}$ atoms/cm$^2$.

Subsequently, in order to activate the impurity implanted to the extension regions 206A, 206B and the source/drain regions 207A, 207B, activation annealing is performed under spike conditions of, e.g., 1000° C. and 0 second.

As described above, in the present embodiment, a structure is formed, in which the first metal oxide film 211 made of the aluminum oxide film or the second metal oxide film 213 made of the lanthanum oxide film is sandwiched between the lower high dielectric constant insulating film 210 and the upper high dielectric constant insulating film 215 which are made of the hafnium oxide film. Then, the annealing is performed to form each of the high dielectric constant insulating film (lanthanum-containing high dielectric constant insulating film) 202A having the high lanthanum concentration in the middle portion thereof and the high dielectric constant insulating film (aluminum-containing high dielectric constant insulating film) 202B having the high aluminum concentration in the middle portion thereof on the oxygen-containing insulating film 201. This solves the problems of the conventional method, i.e., suppresses the degradation of the transistor characteristics due to, e.g., the degradation of the carrier mobility caused by the entering of lanthanum or aluminum into the silicon substrate and the increase in EOT.

Note that, in the present embodiment, a single structure is formed, in which the metal oxide film 211, 213 is sandwiched between the lower high dielectric constant insulating film 210 and the upper high dielectric constant insulating film 215. However, two or more of the foregoing structures may be formed. In other words, after the upper high dielectric constant insulating film 215 is formed at the step illustrated in FIG. 6B, a series of steps illustrated in FIGS. 5B-5D, 6A, and 6B may be repeated more than one time. In such a case, an uppermost high dielectric constant insulating film may not be formed.

In the present embodiment, in order to form the high dielectric constant insulating film 202A, 202B by mixing the lower high dielectric constant insulating film 210, the first metal oxide film 211, 213, and the upper high dielectric constant insulating film 215, the annealing is performed after the step of stacking the upper high dielectric constant insulating film 215 (see FIG. 6B) and before the step of stacking the metal-containing layer 203 (titanium nitride film) (see FIG. 6D). However, timing to perform the annealing is not limited as long as the annealing is performed after the step of stacking the upper high dielectric constant insulating film 215. For example, the annealing may be performed right after the step of stacking the metal-containing layer 203 or the polysilicon layer 204, or the annealing may be performed as the activation annealing of the impurity implanted to the source/drain regions 207A, 207B. In addition, the annealing for mixing the lower high dielectric constant insulating film 210, the metal oxide film 211, 213, and the upper high dielectric constant insulating film 215 to form the high dielectric constant insulating films 202A, 202B is performed at the temperature of about 800° C. in the nitrogen atmosphere, but the present disclosure is not limited to such a configuration. The annealing may be performed at a temperature of equal to or higher than 500° C. and equal to or lower than 1350° C. in inert gas atmosphere or vacuum.

In the present embodiment, the same hafnium oxide film is used as the lower high dielectric constant insulating film 210 and the upper high dielectric constant insulating film 215. However, different types of insulating films may be used as the lower high dielectric constant insulating film 210 and the upper high dielectric constant insulating film 215. For each of the oxygen-containing insulating film 201, the lower high dielectric constant insulating film 210, and the upper high dielectric constant insulating film 215, the same insulating film is used in the N-type FET formation region and the P-type FET formation region. However, for each of these insulating films, different insulating films may be used in the N-type FET formation region and the P-type FET formation region.

In the present embodiment, the following films are used: the silicon oxide film used as the oxygen-containing insulating film 201; the hafnium oxide film used as the lower high dielectric constant insulating film 210 and the upper high dielectric constant insulating film 215; the aluminum oxide film used as the first metal oxide film 211; the lanthanum oxide film used as the second metal oxide film 213; and the titanium nitride film used as the metal-containing layer 203 (metal electrode). However, the foregoing has been set forth merely as an example. Needless to say, other alternative materials realizing the similar advantages may be used.

Needless to say, in the present embodiment, a silicide layer made of, e.g., nickel silicide may be provided in each of a surface portion of the polysilicon layer 204 forming an upper portion of the gate electrode 250A, 250B and a surface portion of the source/drain region 207A, 207B.

What is claimed is:

1. A semiconductor device comprising:
   a first gate insulating film formed on a first region of a semiconductor substrate;
   a first gate electrode formed on the first gate insulating film;
   a second gate insulating film formed on a second region of the semiconductor substrate; and
   a second gate electrode formed on the second gate insulating film,
   wherein the first gate insulating film includes a first oxygen-containing insulating film and a first high dielectric constant insulating film formed on the first oxygen-containing insulating film and containing a first metal,
   the first high dielectric constant insulating film further contains a second metal different from the first metal,
   part of the first high dielectric constant insulating film having a maximum composition ratio of the second metal is away from an interface between the first high dielectric constant insulating film and the first oxygen-containing insulating film and an interface between the first high dielectric constant insulating film and the first gate electrode,
   the second metal exists also in a portion of the first oxygen-containing insulating film near the interface between the first high dielectric constant insulating film and the first oxygen-containing insulating film,
   the second gate insulating film includes a second oxygen-containing insulating film and a second high dielectric constant insulating film formed on the second oxygen-containing insulating film and containing the first metal,
   the second high dielectric constant insulating film further contains a third metal different from the first metal and the second metal, and
   part of the second high dielectric constant insulating film having a maximum composition ratio of the third metal is away from an interface between the second high dielectric constant insulating film and the second oxygen-containing insulating film and an interface between the second high dielectric constant insulating film and the second gate electrode.

2. The semiconductor device of claim 1, wherein
   the first region is an N-type FET formation region, and
   the second metal is lanthanum, dysprosium, scandium, erbium, or strontium.

3. The semiconductor device of claim 1, wherein the second metal exists also at the interface between the first high dielectric constant insulating film and the first oxygen-containing insulating film so that an electric dipole is formed at the interface to reduce threshold voltage to be applied to the first gate electrode.

4. The semiconductor device of claim 1, wherein the first oxygen-containing insulating film is a silicon oxide film.

5. The semiconductor device of claim 1, wherein the first high dielectric constant insulating film is any one of a hafnium oxide film, a hafnium silicon oxide film, a hafnium silicon oxynitride film, a zirconium oxide film, and a hafnium zirconium oxide film.

6. The semiconductor device of claim 1, wherein the first gate electrode includes a first metal-containing layer contacting the first high dielectric constant insulating film.

7. The semiconductor device of claim 6, wherein the first metal-containing layer is a titanium nitride film, a tantalum nitride film, a tantalum carbide film, a tantalum carbide nitride film, or a multilayer film of two or more of these films.

8. The semiconductor device of claim 1, wherein
   the first region is a P-type FET formation region, and
   the second metal is aluminum.

9. The semiconductor device of claim 1, wherein the third metal exists also at the interface between the second high dielectric constant insulating film and the second oxygen-containing insulating film so that an electric dipole is formed at the interface to reduce threshold voltage to be applied to the second gate electrode.

10. The semiconductor device of claim 1, wherein the second oxygen-containing insulating film is a silicon oxide film.

11. The semiconductor device of claim 1, wherein the second high dielectric constant insulating film is any one of a hafnium oxide film, a hafnium silicon oxide film, a hafnium silicon oxynitride film, a zirconium oxide film, and a hafnium zirconium oxide film.

12. The semiconductor device of claim 1, wherein the second gate electrode includes a second metal-containing layer contacting the second high dielectric constant insulating film.

13. The semiconductor device of claim 12, wherein the second metal-containing layer is a titanium nitride film, a tantalum nitride film, a tantalum carbide film, a tantalum carbide nitride film, or a multilayer film of two or more of these films.

14. The semiconductor device of claim 1, wherein
   the first metal is hafnium,
   the second metal is lanthanum, dysprosium, scandium, erbium, or strontium, and
   the third metal is aluminum.

15. The semiconductor device of claim 1, wherein
   the first high dielectric constant insulating film is any one of a hafnium oxide film, a hafnium silicon oxide film, a hafnium silicon oxynitride film, a zirconium oxide film, and a hafnium zirconium oxide film,
   the second metal is lanthanum, dysprosium, scandium, erbium, or strontium,
   the second high dielectric constant insulating film is any one of a hafnium oxide film, a hafnium silicon oxide film, a hafnium silicon oxynitride film, a zirconium oxide film, and a hafnium zirconium oxide film, and
   the third metal is aluminum.

* * * * *